US009263648B2

(12) United States Patent
Yoshida et al.

(10) Patent No.: US 9,263,648 B2
(45) Date of Patent: Feb. 16, 2016

(54) METHOD OF MANUFACTURING AN INTEGRATED PIECE COMPRISING A CONVEX CURED PRODUCT AND A SUBSTRATE

(71) Applicants: Dow Corning Toray Co., Ltd., Tokyo (JP); Dow Corning Korea Ltd., Seoul (KR)

(72) Inventors: Shin Yoshida, Ichihara (JP); Jongchan Park, Jincheon-Gun (KR)

(73) Assignees: DOW CORNING TORAY CO., LTD., Tokyo (JP); DOW CORNING KOREA LTD., Seoul (KR)

( * ) Notice: Subject to any disclaimer, the term of this patent is extended or adjusted under 35 U.S.C. 154(b) by 0 days.

(21) Appl. No.: 14/435,881

(22) PCT Filed: Oct. 11, 2013

(86) PCT No.: PCT/JP2013/078393
§ 371 (c)(1),
(2) Date: Apr. 15, 2015

(87) PCT Pub. No.: WO2014/061815
PCT Pub. Date: Apr. 24, 2014

(65) Prior Publication Data
US 2015/0295147 A1    Oct. 15, 2015

(30) Foreign Application Priority Data

Oct. 15, 2012    (JP) ................................ 2012-228327

(51) Int. Cl.
*H01L 33/54*    (2010.01)
*H01L 33/56*    (2010.01)
(Continued)

(52) U.S. Cl.
CPC .............. *H01L 33/54* (2013.01); *C08K 5/5435* (2013.01); *C08L 83/04* (2013.01); *H01L 33/0095* (2013.01); *H01L 33/56* (2013.01); *H01L 2924/0002* (2013.01); *H01L 2933/005* (2013.01)

(58) Field of Classification Search
CPC ... H01L 21/02104; H01L 33/54; H01L 33/56; H01L 33/0095; H01L 2933/005; C08K 5/5435

USPC ........... 526/126; 524/88, 264, 265, 494, 588; 523/107, 210; 438/26, 28, 127; 428/447; 264/1.24, 272.11; 257/98, 257/100, 791, E21.001, E33.001

See application file for complete search history.

(56) References Cited

U.S. PATENT DOCUMENTS

| 8,202,933 B2 * | 6/2012 | Miyawaki ............. H01L 23/296 257/791 |
| 2012/0263959 A1 * | 10/2012 | Yoshida ................... B32B 7/12 428/447 |

(Continued)

FOREIGN PATENT DOCUMENTS

| JP | 2008-231199 A | 10/2008 |
| JP | 2009-235265 A | 10/2009 |

(Continued)

OTHER PUBLICATIONS

International Search Report for Application No. PCT/JP2013/078393 dated Dec. 2, 2013, 3 pages.
(Continued)

*Primary Examiner* — Dao H Nguyen
(74) *Attorney, Agent, or Firm* — Howard & Howard Attorneys PLLC

(57) ABSTRACT

The present invention relates to a method of manufacturing an integrated piece comprising a convex cured product and a substrate, the method comprising a step of: depositing dropwise or dispensing a curable silicone composition onto the pre-heated substrate, the composition reaching a torque value of 1 dN·m within 60 seconds from immediately after beginning measurement as measured using a curelastometer according to JIS K 6300-2, at the temperature to which the substrate is heated, and having a viscosity at said temperature of at least 0.05 Pa·s. The method allows for the efficient manufacture of a hemispherical, hemicylindrical, domeshaped, or similar convex cured product upon a substrate using a curable silicone composition.

17 Claims, 3 Drawing Sheets

(51) Int. Cl.
*C08F 30/08* (2006.01)
*C08K 5/5435* (2006.01)
*C08L 83/04* (2006.01)
*H01L 33/00* (2010.01)

(56) References Cited

U.S. PATENT DOCUMENTS

| | | | |
|---|---|---|---|
| 2014/0235806 A1* | 8/2014 | Miyamoto | C08L 83/04 526/126 |
| 2015/0290887 A1* | 10/2015 | Swier | B29D 11/00451 428/447 |
| 2015/0315427 A1* | 11/2015 | Yoshida | H01L 23/10 257/791 |
| 2015/0318455 A1* | 11/2015 | Kurtin | C09K 11/02 425/130 |

FOREIGN PATENT DOCUMENTS

| WO | WO 2005/062368 A1 | 7/2005 |
|---|---|---|
| WO | WO 2005/091361 A1 | 9/2005 |

OTHER PUBLICATIONS

English language abstract for JP 2008-231199 extracted from espacenet.com database on Apr. 29, 2015, 2 pages.
English language abstract and machine-assisted English translation for JP 2009-235265 extracted from espacenet.com database on Apr. 29, 2015, 30 pages.

* cited by examiner

METHOD OF MANUFACTURING AN INTEGRATED PIECE COMPRISING A CONVEX CURED PRODUCT AND A SUBSTRATE

RELATED APPLICATIONS

This application is the National Stage of International Patent Application No. PCT/JP2013/078393, filed on Oct. 11, 2013, which claims priority to and all the advantages of Japanese Patent Application No. 2012-228327, filed on Oct. 15, 2012, the content of which is expressly incorporated herein by reference in its entirety.

TECHNICAL FIELD

The present invention relates to a method of manufacturing an integrated piece in which a convex cured product is formed upon a substrate using a curable silicone composition, and, in particular, to a method of manufacturing an integrated piece in which a convex cured product is formed upon a semiconductor element or a substrate upon which said element is mounted.

BACKGROUND ART

Curable silicone compositions are used in photocouplers, light-emitting diodes, solid-state image sensing devices, and other types of optical semiconductor devices having optical semiconductor elements in order to seal the elements. It is demanded of these compositions that cured products thereof do not absorb or scatter light emitted or received by the optical semiconductor elements, and, at times, that the cured products be hemispherical, hemicylindrical, dome-shaped, or a similar convex shape in order to improve the optical properties of the optical semiconductor device.

For example, Japanese Unexamined Patent Application Publication No. 2008-231199 discloses potting a thixotropic curable silicone composition to seal a light-emitting element, and imparting the sealing body with a convex lens shape.

Japanese Unexamined Patent Application Publication No. 2009-235265 discloses depositing a thixotropic curable silicone composition dropwise upon a substrate using a dispenser to seal a light-emitting element, and imparting the sealing body with a convex lens shape.

However, the methods disclosed in Japanese Unexamined Patent Application Publication Nos. 2008-231199 and 2009-235265 present the problem that it is difficult to control thixotropy, making a sealing body having the desired hemispherical, hemicylindrical, dome-shaped or the like convex shape impossible to obtain in practice. In addition, the high viscosity of the thixotropic curable silicone composition impedes swift dispensing thereof from a dispenser, leading to the problems of time being required to dispense the composition and threads forming when the composition is dispensed. Moreover, depending upon the filler added to the curable silicone composition in order to impart thixotropic properties thereto, the curable silicone composition may cloud, leading to problems in optical properties.

The present invention was achieved in light of the problems in the prior art as described above, and has as an object thereof the provision of a method capable of efficiently manufacturing an integrated piece in which a curable silicone composition is used to form a convex cured product upon a substrate.

DISCLOSURE OF INVENTION

As the result of diligent research in order to achieve the object described above, the inventors discovered that pre-setting the temperature of the substrate when depositing dropwise or dispensing a curable silicone composition of a particular viscosity and curing properties onto a substrate allows for the efficient manufacture of an integrated piece in which a desired convex cured product is formed, thereby arriving at the present invention.

Specifically, the object of the present invention is achieved via a method of manufacturing an integrated piece comprising a convex cured product and a substrate, the method comprising a step of: depositing dropwise or dispensing a curable silicone composition onto the pre-heated substrate, the composition reaching a torque value of 1 dN·m within 60 seconds from immediately after beginning measurement as measured using a curelastometer according to JIS K 6300-2, at the temperature to which the substrate is heated, and having a viscosity at said temperature of at least 0.05 Pa·s.

In the manufacturing method according to the present invention, the substrate is preferably pre-heated to at least 50° C. Specifically, the substrate is preferably heated to a temperature such that the ratio of the viscosity of the curable silicone composition at the temperature to which the substrate is heated to the viscosity of the curable silicone composition at 25° C. is at least 0.01. In addition, the substrate is preferably a semiconductor device or a substrate for a semiconductor device; in particular, the semiconductor device is preferably an optical semiconductor device.

The curable silicone composition preferably has a viscosity at 25° C. of at least 2.0 Pa·s and a refractive index at 25° C. of less than 1.50. Such a curable silicone composition preferably thermally cures via a hydrosilylation reaction.

The convex cured product can envelop a semiconductor element. The semiconductor element can be present on the substrate.

The semiconductor element is preferably constituted by an optical semiconductor.

The optical semiconductor is preferably an LED.

The present invention also relates to an optical device comprising an integrated piece obtained according to the production method described above.

EFFECTS OF INVENTION

In accordance with the present invention, it is possible to efficiently manufacture an integrated piece in which a hemispherical, hemicylindrical, dome-shaped, or similar convex cured product is formed on a substrate using a curable silicone composition.

In particular, in the manufacturing method according to the present invention, there is no need to pre-form a dam member for preventing the spread of the curable silicone composition after being deposited dropwise or dispensed onto the substrate. A convex cured product having a hemispherical, hemicylindrical, dome-shaped, or similar convex shape can thus be easily manufactured even if the substrate has a flat surface.

DETAILED DESCRIPTION OF THE INVENTION

Figure 1:
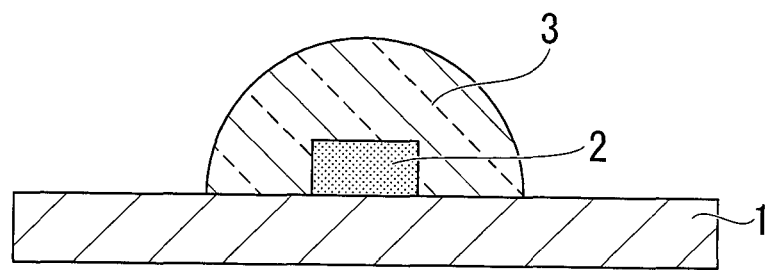
FIG. 1 is a schematic cross-sectional view of one example of an optical device manufactured according to the manufacturing method of the present invention.

In the manufacturing method according to the present invention, a curable silicone composition having predetermined viscosity properties and predetermined curing properties is deposited dropwise or dispensed onto a pre-heated substrate.

There is no particular limitation upon the substrate used in the present invention as long as it is heat-resistant; examples of substrate materials include: metals such as silver, gold, copper, aluminum, and nickel; semiconductors such as silicon; glasses such as heat-resistant glass; high melting point thermoplastic resins; thermosetting resins such as epoxy resins, BT resins, polyimide resins, and silicone resins; ceramic such as alumina and alumina nitride; and composites thereof.

In the present invention, the substrate is pre-heated. In the present invention, the heating temperature must be adjusted according to the curing properties of the curable silicone composition. There is no particular limitation upon the heating temperature, but a temperature of at least 50° C. is preferable, a temperature of at least 60° C. is more preferable, a temperature of at least 70° C. is still more preferable, and a temperature of at least 80° C. is especially preferable. There is also no limitation upon the upper limit of the heating temperature, but a temperature of no more than 220° C. is preferable, a temperature of no more than 180° C. is more preferable, and a temperature of no more than 160° C. is still more preferable. There is no particular limitation upon the method of heating, and any heating method, such as direct heating via hot plate or the like, radiation heating via infrared radiation, or induction heating via microwaves, can be employed.

The refractive index of the curable silicone composition used in the present invention is preferably less than 1.50. The refractive index of the cured product thereof is also preferably less than 1.50. The refractive index can be measured using, for example, an Abbe refractometer. In such cases, the wavelength of the light source for the Abbe refractometer can be altered to measure a refractive index at a desired wavelength. The curable silicone composition or cured product thereof preferably has a refractive index (25° C.) at a visible light wavelength (589 nm) of less than 1.50, more preferably from 1.40 to 1.49, still more preferably from 1.42 to 1.47. Generally, the curable silicone composition is preferably a non-phenylic composition containing, as a main component, an organopolysiloxane having a methyl group or other alkyl group, such as dimethylpolysiloxane.

The curable silicone composition or cured product thereof used in the present invention preferably has an optical transmittance (25° C.) of at least 80%, more preferably at least 90%, still more preferably at least 95%. This optical transmittance can be found, for example, by measuring the optical transmittance (25° C.) of the curable silicone composition or the cured product with a spectrophotometer at a light path length of 0.1 cm and a wavelength of 450 nm.

The curable silicone composition used in the present invention is preferably a non-phenylic curable silicone composition not having a silicon-bonded phenyl group. It is more preferable for aryl groups other than phenyl groups not to be bonded to silicon atoms.

There are no particular limitations upon the curable silicone composition; examples include (A) an organopolysiloxane having at least two alkenyl groups in a molecule, (B) an organopolysiloxane having at least two silicon-bonded hydrogen atoms in a molecule, and (C) a hydrosilylation-curable silicone composition containing at least a hydrosilylation catalyst.

Component (A) preferably has a viscosity at 25° C. in a range of 50 to 100,000 mPa·s.

There is no limitation upon the molecular structure of component (A); examples include a straight, partially branched straight, branched, dendritic, reticulated, or cyclic structure.

Examples of the alkenyl group in component (A) include straight or branched alkenyl groups having from 2 to 10 carbons, such as vinyl groups, allyl groups, propenyl groups, isopropenyl groups, butenyl groups, pentenyl groups, and hexenyl groups. Vinyl groups or allyl groups are preferable, and vinyl groups are more preferable. Component (A) may optionally have three or more silicon-bonded alkenyl groups in a molecule.

Examples of alkyl groups having from 1 to 10 carbons in component (A) include methyl groups, ethyl groups, propyl groups, isopropyl groups, butyl groups, isobutyl groups, tert-butyl groups, pentyl groups, neopentyl groups, hexyl groups, heptyl groups, and other straight or branched alkyl groups. Part of hydrogen atoms in the alkyl groups may be substituted by halogen atoms, hydroxyl groups, epoxy groups, and the like, such as chloromethyl groups, 3-chloropropyl groups, 3,3,3-trifluoropropyl groups, and other halogen-substituted alkyl groups.

Examples of component (A) include methylvinylpolysiloxane capped at both molecular terminals with trimethylsiloxy groups, copolymers of methylvinylsiloxane and dimethylsiloxane capped at both molecular terminals with trimethylsiloxy groups, methylvinylpolysiloxane capped at both molecular terminals with dimethylvinylsiloxy groups, copolymers of dimethylsiloxane and methylvinylsiloxane capped at both molecular terminals with dimethylvinylsiloxy groups, cyclic methylvinylsiloxane, cyclic dimethylsiloxane-methylvinylsiloxane copolymer, copolymers constituted by siloxane units represented by the formula: $(CH_3)_3SiO_{1/2}$, siloxane units represented by the formula: $(CH_2=CH)(CH_3)_2SiO_{1/2}$, and siloxane units represented by the formula: $SiO_{4/2}$, copolymers constituted by siloxane units represented by the formula: $(CH_2=CH)(CH_3)_2SiO_{1/2}$ and siloxane units represented by the formula: $SiO_{4/2}$, copolymers of siloxane units represented by the formula: $(CH_3)_3SiO_{1/2}$, siloxane units represented by the formula: $(CH_2=CH)(CH_3)_2SiO_{1/2}$, siloxane units represented by the formula: $(CH_3)_2SiO_{2/2}$, and siloxane units represented by the formula: $SiO_{4/2}$, and mixtures of two or more of the above. Dimethylpolysiloxane capped at both molecular terminals with dimethylvinylsiloxy groups, copolymers of dimethylsiloxane and methylvinylsiloxane capped at both molecular terminals with trimethylsiloxy groups, and copolymers of siloxane units represented by the formula: $SiO_{4/2}$ and siloxane units represented by the formula: $(CH_2=CH)(CH_3)_2SiO_{1/2}$ are especially preferable.

Component (B) preferably has a viscosity at 25° C. in a range of 1 to 1,000 mPa·s, more preferably in a range of 1 to 500 mPa·s, still more preferably in a range of 1 to 100 mPa·s.

There is no limitation upon the molecular structure of the component (B); examples include a straight, partially branched straight, branched, dendritic, reticulated, or cyclic structure.

The amount of the component (B) is preferably an amount such that component (B) supplies an amount of silicon-bonded hydrogen atoms in a range of 0.5 to 2.0 mol, preferably in a range of 0.8 to 1.8 mol, per 1 mol of total alkenyl groups in component (A).

Examples of component (B) include methylhydrogenpolysiloxane capped at both molecular terminals with trimethylsiloxy groups, copolymer of dimethylsiloxane and methylhydrogensiloxane capped at both molecular terminals with trimethylsiloxy groups, methylhydrogenpolysiloxane capped at both molecular terminals with dimethylhydrogensiloxy groups, copolymer of dimethylsiloxane and methylhydrogensiloxane capped at both molecular terminals with dimethylhydrogensiloxy groups, cyclic methylhydrogensiloxane, cyclic dimethylsiloxane-methylhydrogensiloxane copolymer, copolymers of siloxane units represented by the formula: $(CH_3)_3SiO_{1/2}$, siloxane units represented by the formula: $H(CH_3)_2SiO_{1/2}$ and siloxane units represented by the formula: $SiO_{4/2}$, copolymers of siloxane units represented by the formula: $H(CH_3)_2SiO_{4/2}$ and siloxane units represented by the formula: $SiO_{4/2}$, copolymers of siloxane units represented by the formula: $(CH_3)_3SiO_{1/2}$, siloxane units represented by the formula: $H(CH_3)_2SiO_{1/2}$, siloxane units represented by the formula: $(CH_3)_2SiO_{2/2}$ and siloxane units represented by the formula: $SiO_{4/2}$, and mixtures of two or more of these; in particular, methylhydrogenpolysiloxane capped at both molecular terminals with trimethylsiloxy groups, copolymer of dimethylsiloxane and methylhydrogensiloxane capped at both molecular terminals with trimethylsiloxy groups, and copolymers of siloxane units represented by the formula: $SiO_{4/2}$ and siloxane units represented by the formula: $H(CH_3)_2SiO_{1/2}$ are preferable.

Component (C) is a hydrosilylation catalyst for promoting a hydrosilylation reaction in the curable silicone composition used in the present invention. Component (C) is preferably a platinum group element catalyst or a platinum group element compound catalyst, examples including platinum-based catalysts, rhodium-based catalysts, and palladium-based catalysts. A platinum-based catalyst is especially preferable due to its ability to markedly promote a hydrosilylation reaction of components (A) and (B), and thus the curing of the present composition. Examples of platinum-based catalysts include finely powdered platinum; platinum black; chloroplatinic acid, alcohol-modified chloroplatinic acid; chloroplatinic acid/diolefin complexes; platinum/olefin complexes; platinum bis(acetoacetate), platinum bis(acetylacetonate), and other platinum/carbonyl complexes; chloroplatinic acid/divinyltetramethyl disiloxane complexes, chloroplatinic acid/tetravinyl tetramethyl cyclotetrasiloxane complexes, and other chloroplatinic acid/alkenylsiloxane complexes; platinum/divinyltetramethyl disiloxane complexes, platinum/tetravinyl tetramethyl cyclotetrasiloxane complexes, and other platinum/alkenylsiloxane complexes; and complexes of chloroplatinic acid and acetylene alcohols. Of these, platinum-alkenylsiloxane complexes are especially preferable due to their satisfactory hydrosilylation reaction capability.

Examples of alkenylsiloxanes include 1,3-divinyl-1,1,3,3-tetramethyldisiloxane, 1,3,5,7-tetramethyl-1,3,5,7-tetravinyl cyclotetrasiloxane, alkenylsiloxane oligomers in which part of methyl groups of these alkenylsiloxanes are substituted by ethyl groups, phenyl groups, or the like, and alkenylsiloxane oligomers in which vinyl groups of these alkenylsiloxanes are substituted by allyl groups, hexenyl groups, or the like. In particular, 1,3-divinyl-1,1,3,3-tetramethyldisiloxane is preferable due to the favorable stability of the platinum-alkenylsiloxane complex that is produced.

In order to improve the stability of the platinum-alkenylsiloxane complexes, it is preferable to dissolve these platinum-alkenylsiloxane complexes in an alkenylsiloxane oligomer such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, or 1,3,5,7-tetramethyl-1,3,5,7-tetravinylcyclotetrasiloxane or an organosiloxane oligomer such as a dimethylsiloxane oligomer, and it is particularly preferable to dissolve the complexes in an alkenylsiloxane oligomer.

There is no particular limitation upon the amount of component (C) so long as it is capable of promoting the curing of the composition; specifically, the amount in weight units of platinum group metal atoms, especially platinum atoms, in the component with respect to the curable silicone composition is preferably in a range of 0.01 to 500 ppm, more preferably in a range of 0.01 to 100 ppm, especially preferably in a range of 0.1 to 50 ppm. This is because the composition will not cure sufficiently if the amount of component (C) is less than the lower limit of the range described above, and problems such as discoloration of the cured product may occur if the amount exceeds the upper limit of the range described above.

The curable silicone composition used in the present invention may optionally be thixotropic to an extent that it is transparent. In order to impart the curable silicone composition used in the present invention with thixotropy, from 1 to 20 parts by mass of an inorganic filler having a BET specific surface area of from 50 to 500 $m^2$/g per 100 parts total mass of components (A) to (C) may be optionally added. This is because a BET specific surface area or content less or greater than the ranges described above may not be capable of imparting a suitable degree of thixotropy in terms of ease of handling.

Examples of the inorganic filler include silica, alumina, titanium oxide, and glass, silica being especially preferable, and fumed silica being even more preferable.

In order to extend usable life at room temperature and storage stability, it is preferable that the curable silicone composition used in the present invention contains a hydrosilylation reaction inhibitor such as 1-ethynyl cyclohexan-1-ol, 2-methyl-3-butyn-2-ol, 3,5-dimethyl-1-hexyn-3-ol, 2-phenyl-3-butyn-2-ol, or other alkyne alcohols; 3-methyl-3-penten-1-yne, 3,5-dimethyl-3-hexen-1-yne, or other enyne compounds; 1,3,5,7-tetramethyl-1,3,5,7-tetravinylcyclotetrasiloxane, 1,3,5,7-tetramethyl-1,3,5,7-tetrahexenylcyclotetrasiloxane, or other methylalkenylsiloxane oligomers; dimethyl bis(3-methyl-1-butyn-3-oxy)silane, methylvinyl bis(3-methyl-1-butyn-3-oxy)silane, or other alkyne oxysilanes; and benzotriazole.

The added amount thereof should be sufficient to suppress gelling or curing when components (A) to (C) are mixed, and sufficient to allow for long-term storage; specifically, an amount in a range of 0.0001 to 5 parts by mass per 100 parts total mass of components (A) to (C) is preferable, and an amount in a range of 0.01 to 3 parts by mass is more preferable.

The curable silicone composition used in the present invention preferably includes an adhesion promoter in order to further improve adhesion to the substrate under contact during curing. A known adhesion promoter capable of being added to a curable organopolysiloxane composition that cures as the result of a hydrosilylation reaction can be used.

Examples of adhesion promoters include: organosilanes or linear, branched, or cyclic organosiloxane oligomers having approximately 4 to 20 silicon atoms having a trialkoxysiloxy group (e.g., a trimethoxysiloxy group or triethoxysiloxy group) or a trialkoxysilylalkyl group (e.g., a trimethoxysilylethyl group or triethoxysilylethyl group) and a hydrosilyl group or alkenyl group (e.g., a vinyl group or allyl group); organosilanes or linear, branched, or cyclic organosiloxane oligomers having approximately 4 to 20 silicon atoms having a trialkoxysiloxy group or trialkoxysilylalkyl group, and a methacryloxyalkyl group (e.g., a 3-methacryloxypropyl group); organosilanes or linear, branched, or cyclic organosiloxane oligomers having approximately 4 to 20 silicon atoms having a trialkoxysiloxy group or trialkoxysilylalkyl group, and an epoxy group-bonded alkyl group (e.g., a 3-glycidoxypropyl group, 4-glycidoxybutyl group, 2-(3,4-epoxycyclohexyl)ethyl group, or 3-(3,4-epoxycyclohexyl)propyl group); and reaction products of aminoalkyltrialkoxysilanes and epoxy group-bonded alkyltrialkoxysilanes, and epoxy group-containing ethyl polysilicate. Specific examples of adhesion promoters include: vinyl trimethoxysilane, allyl trimethoxysilane, allyl triethoxysilane, hydrogen triethoxysilane, 3-glycidoxypropyl trimethoxysilane, 3-glycidoxypropyl triethoxysilane, 2-(3,4-epoxy cyclohexyl)ethyl trimethoxysilane, 3-methacryloxypropyl trimethoxysilane, 3-methacryloxypropyl triethoxysilane, reaction products of 3-glycidoxypropyl triethoxysilane and 3-aminopropyl triethoxysilane, condensation reaction products of silanol group chain-terminated methylvinylsiloxane oligomers and 3-glycidoxypropyltrimethoxysilane, condensation reaction products of silanol group chain-terminated methylvinylsiloxane oligomers and 3-methacryloxypropyl triethoxysilane, and tris(3-trimethoxysilylpropyl) isocyanurate.

From considerations of handling/workability, the curable silicone composition used in the present invention preferably has a viscosity at 25° C. of at least 2.0 Pa·s, more preferably at least 3.0 Pa·s; meanwhile, while there is no particular limitation upon the upper limit for the viscosity, a viscosity of no more than 1,000 Pa·s is preferable, a viscosity of no more than 500 Pa·s is more preferable, a viscosity of no more than 50 Pa·s is even more preferable, and a viscosity of no more than 20 Pa·s is especially preferable.

In order to suppress spreading of the curable silicone composition used in the present invention on the substrate after being deposited dropwise or dispensed thereupon, the viscosity thereof at the temperature to which the substrate is heated is at least 0.05 Pa·s, and preferably at least 0.1 Pa·s. It is preferable for the curable silicone composition to have a certain degree of fluidity so as to take on a rounded shape after being deposited dropwise or dispensed; specifically, viscosity at the heating temperature is preferably no more than 100 Pa·s, more preferably no more than 50 Pa·s, and especially preferably no more than 10 Pa·s. If the curable silicone composition contains a curing agent or curing catalyst, the value for the viscosity thereof at the heating temperature can be measured after deactivating the curing catalyst or curing agent. For instance, in the case of a hydrosilylation-curable silicone composition, the hydrosilylation catalyst can be poisoned using an organic compound containing sulfur, nitrogen, phosphorus, or other atoms; an ionic compound of a heavy metal such as tin, lead, mercury, bismuth, arsenic, or the like; or an organic compound having an aliphatic multiple bond such as acetylene or the like, allowing the viscosity thereof to be measured.

Taking $\eta_{25°\,C.}$ as the viscosity (mPa·s) at 25° C. and $\eta_{120°\,C.}$ as the viscosity (mPa·s) at 120° C. of the curable silicone composition used in the present invention, the value of the formula $\text{Log}_{10}\eta_{120°\,C.}/\text{Log}_{10}\eta_{25°\,C.}$ is preferably from 0.70 to 1.00.

The ratio of the viscosity of the curable silicone composition used in the present invention at the temperature to which the substrate is heated to the viscosity thereof at 25° C. is preferably at least 0.01, more preferably at least 0.015, and still more preferably at least 0.02.

In order to further stabilize the form, the curing rate of the curable silicone composition used in the present invention is such that the time (TS-1) from immediately after beginning of the measurement until a torque value of 1 dN·m is reached, measured using a curelastometer according to JIS K 6300-2 at the curing temperature, is no more than 60 seconds, preferably no more than 40 seconds, more preferably no more than 30 seconds, and still more preferably no more than 20 seconds.

If the curable silicone composition used in the present invention is, for example, a hydrosilylation-curable silicone composition, the curing rate thereof can be adjusted by adjusting component (C) content, or the type or amount of hydrosilylation reaction inhibitor. Examples of such hydrosilylation-curable silicone composition include JCR6125, OE-6370HF, and OE-6370M, all manufactured by Dow Corning Toray Co., Ltd., or the like.

A method known in the art can be used to deposit dropwise or dispense the curable silicone composition onto a preheated substrate, dropwise depositing using a general-purpose dispenser being preferable. When being deposited dropwise or dispensed, the curable silicone composition may be at room temperature, or may be heated to a temperature such that it will not cure. There is no particular limitation upon the amount of dispensed composition; for example, from 1 to 100 mg, and preferably from 10 to 50 mg, can be dispensed from the dispenser at a time. The dispensing rate of the curable silicone composition from the dispenser is preferably from 0.1 to 20 mg/sec, more preferably from 1 to 10 mg/sec.

After being deposited dropwise or dispensed, the curable silicone composition on the substrate is rapidly cured by the heat of the substrate, forming a cured product. The cured product can be hemispherical, hemicylindrical, dome-shaped, or a similar convex shape, and is preferably hemispherical.

The contact angle of the cured product (lens-shaped sealing body) and the substrate is preferably at least 60°, more preferably at least 70°, still more preferably at least 80°, and especially preferably from 85 to 90°.

Secondary curing (post-curing) may optionally be performed, as necessary, upon the cured product obtained according to the present invention at, for example, a temperature of from 100 to 200° C., preferably from 140 to 180° C.

The cured product can envelop a semiconductor element. Examples of semiconductor elements include silicon semiconductors, gallium phosphide semiconductors, gallium arsenide semiconductors, gallium nitride semiconductors, and the like.

The semiconductor element may be an optical semiconductor element. Specific examples of the optical semiconductor element include light-emitting diodes (LEDs), semiconductor lasers, photodiodes, phototransistors, solid-state image sensing devices, and light emitters and receivers for photocouplers; the optical semiconductor element is preferably a light-emitting diode (LED).

The present invention also relates to an optical device provided with a convex cured product obtained as described above. FIGS. 1 to 4 depict optical devices having an LED 2 mounted on a substrate 1 having a flat surface, and further provided with a convex cured product 3. The LED 2 and an electrode (not illustrated) on the substrate 1 are connected by a wire or the like (also not illustrated).

Figure 2:
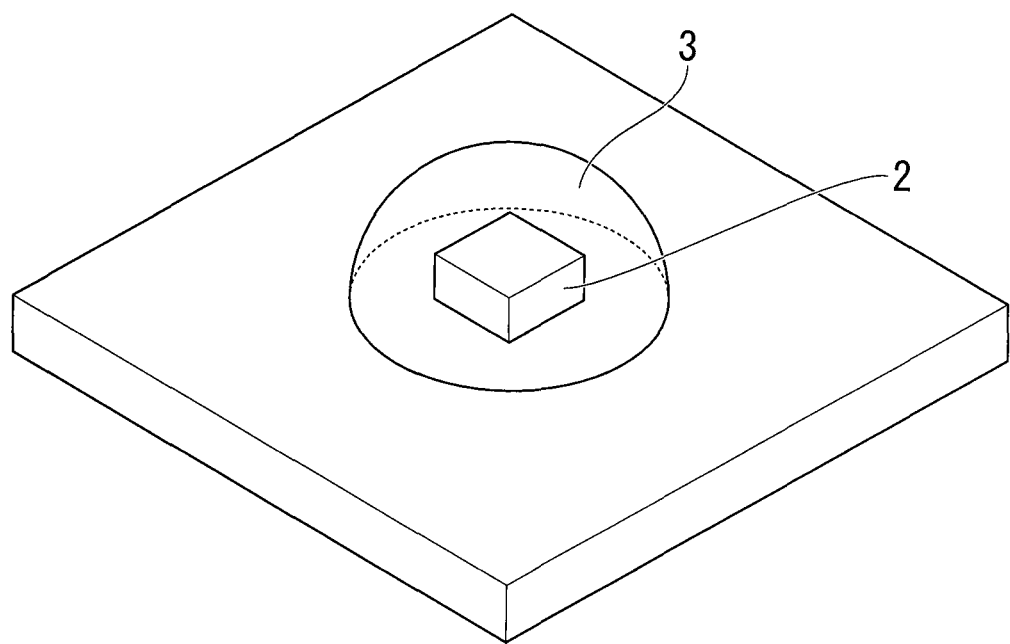
FIG. 2 is a schematic transparent perspective view of the optical device illustrated in FIG. 1.

The optical device according to the present invention shown in FIGS. 1 and 2 can be manufactured by depositing the curable silicone composition dropwise upon the substrate 1 so as to cover the LED 2, curing the composition, and forming a convex cured product 3. The convex cured product 3 of the optical device according to the present invention shown in FIGS. 1 and 2 is hemispherical, making it possible to control the direction of light projection and to keep head-on brightness from becoming too great, thereby allowing for superior optical properties.

Figure 3:
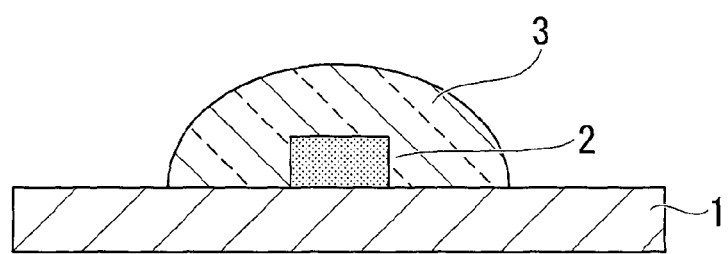
FIG. 3 is a schematic cross-sectional view of another example of an optical device manufactured according to the manufacturing method of the present invention.

FIG. 3 depicts an optical device provided with a convex cured product 3 having a slightly flattened dome shape, unlike that shown in FIG. 1. As in the case of the optical device shown in FIGS. 1 and 2, the LED 2 and an electrode (not illustrated) on the substrate 1 are connected by a wire or the like (also not illustrated). The convex cured product 3 of the optical device according to the present invention illustrated in FIG. 3 is slightly flattened, allowing the thickness of the optical device to be kept down.

Figure 4:
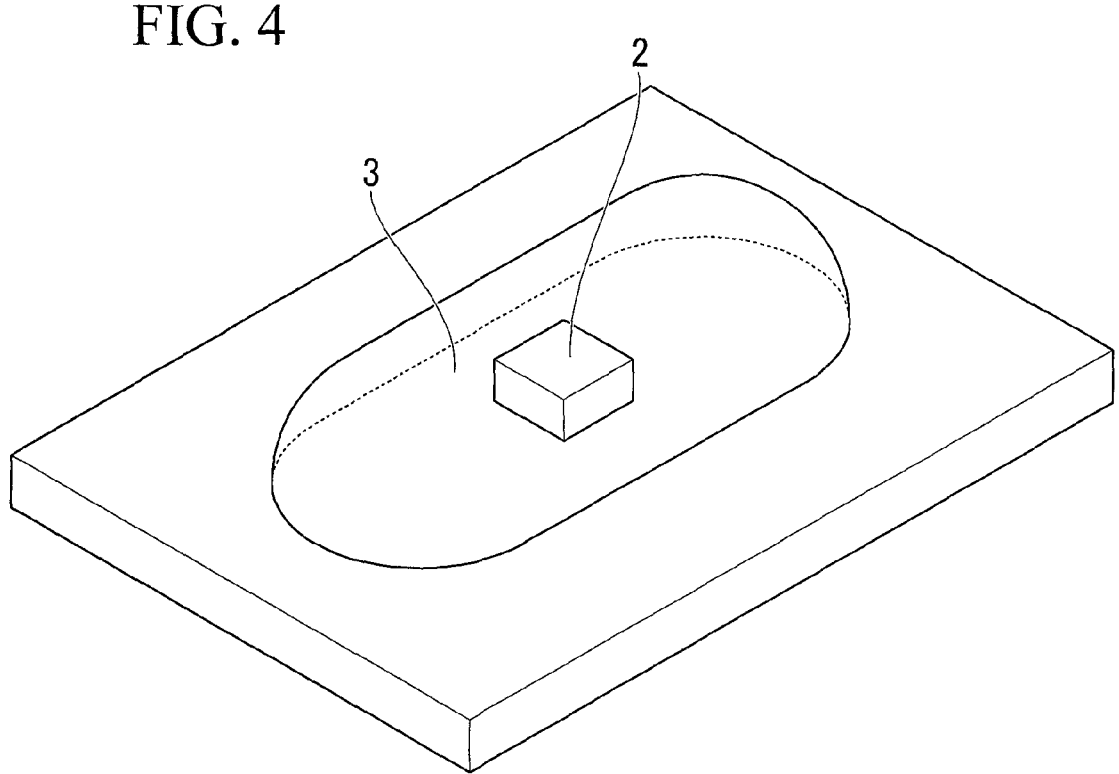
FIG. 4 is a schematic transparent perspective view of another example of an optical device manufactured according to the manufacturing method of the present invention.

FIG. 4 depicts an optical device provided with a convex cured product 3 having a hemicylindrical shape, unlike that shown in FIG. 1. As in the case of the optical device illustrated in FIGS. 1 and 2, the LED 2 and an electrode (not illustrated) on the substrate 1 are connected by a wire or the like (also not illustrated). The convex cured product 3 of the optical device according to the present invention illustrated in FIG. 4 has a hemicylindrical shape, allowing for comparatively dense disposition of the convex cured product 3 upon the substrate 1.

In the embodiments illustrated in FIGS. 1 to 4, there is no need to provide, upon the surface of the substrate 1, a dam member (projection) for preventing the spread of the curable silicone composition deposited dropwise upon the surface of the substrate 1. A hemispherical, hemicylindrical, dome-shaped, or similar convex cured product 3 can thus be easily manufactured even if the substrate 1 has a flat surface. Moreover, because there is no need for a dam member for preventing the spread of the curable silicone composition, there is also no need to cut the dam member via dicing in the optical device obtained according to the manufacturing method of the present invention.

Figure 5:
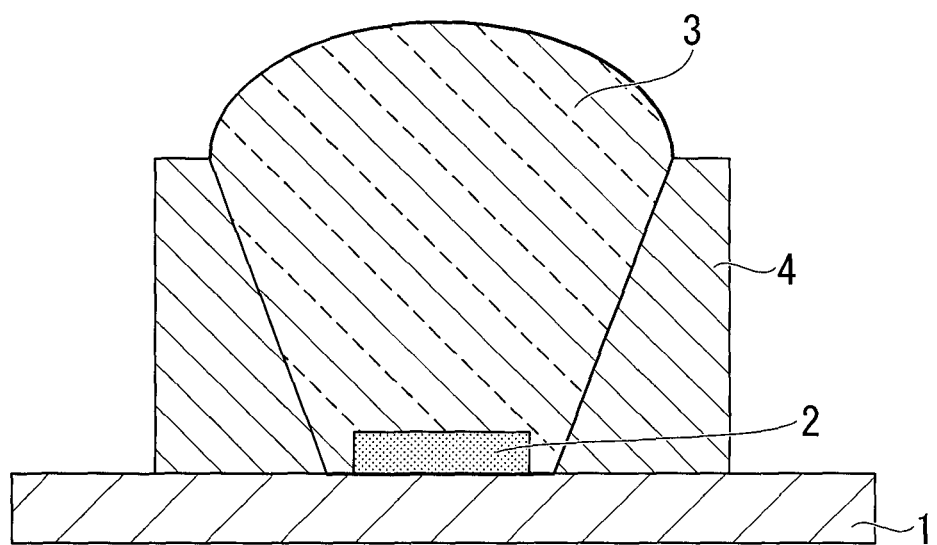
FIG. 5 is a schematic cross-sectional view of another example of an optical device manufactured according to the manufacturing method of the present invention.

Meanwhile, FIG. 5 depicts an optical device comprising a reflective member 4 surrounding the LED 2, unlike FIGS. 1 to 4. The optical device according to the present invention depicted in FIG. 5 is provided with an LED 2 and a reflective member 4 upon the substrate 1, as well as a convex cured product 3. The LED 2 and an electrode (not illustrated) on the substrate 1 are connected by a wire or the like (also not illustrated). The optical device according to the present invention illustrated in FIG. 5 can be manufactured by depositing the curable silicone composition dropwise within the frame of the reflective member 4 so as to cover the LED 2, curing the composition, and forming a convex cured product 3. Conventionally, an optical device similar to that illustrated in FIG. 5 can be manufactured by filling a frame with a sealing material, followed by bonding a lens thereto. However, in the manufacturing method according to the present invention, the process of filling with sealing material and the process of forming the lens can be performed simultaneously, allowing the process of manufacturing the optical device to be simplified. In addition, the need to bond the lens and the sealing material is eliminated, allowing reflection of light between the lens and the sealing material to be eliminated.

EXAMPLES

The present invention will be described below using examples, but the present invention is not limited thereto. Table 1 shows the properties of the hydrosilylation-curable silicone composition manufactured by Dow Corning Toray Co., Ltd., used in the practical examples and comparative examples. 500 ppm of phenanthroline per weight of the composition was added to the curable silicone composition in order to inhibit hydrosilylation reactions. Using a Brookfield type viscometer (manufactured by Brookfield Engineering; model: DV-III) and a SC4-21 spindle having a rotational speed of 1 rpm, the viscosity of the composition with the added phenanthroline was measured at various temperatures. Results are shown in Table 1. In Table 1, "TS-1" indicates the time (seconds) from immediately after beginning measurement until a torque value of 1 dN·m was reached, measured using a curelastometer (manufactured by Alpha Technologies; model: MDR 2000P), stipulated in JIS K 6300-2, at a frequency of 1.66 Hz.

TABLE 1

| Type of curable silicone composition | Characteristics of the composition | | Characteristics of the cured product | | Properties at curing temperature | | |
|---|---|---|---|---|---|---|---|
| | Viscosity (25° C.) Pa·s | Refractive index | Hardness | Appearance | Temperature (° C.) | TS-1 (seconds) | Viscosity at heating temperature (Pa·s) |
| JCR6125 | 9.1 | 1.41 | Type A durometer hardness 23 | Semi-transparent | 150 | 9 | 3.2 |
| | | | | | 120 | 25 | 4.8 |
| OE-6370HF | 5.6 | 1.41 | Type A durometer hardness 70 | Transparent | 180 | 7 | 0.1 |
| | | | | | 150 | 14 | 0.3 |
| | | | | | 130 | 34 | 0.4 |
| | | | | | 120 | 77 | 0.5 |
| | | | | | 25 | >600 | 5.6 |
| OE-6630 | 2.5 | 1.53 | Type D durometer hardness 33 | Transparent | 150 | 20 | 0.02 |
| | | | | | 120 | 34 | 0.04 |
| OE-6636 | 7.5 | 1.54 | Type D durometer hardness 33 | Transparent | 150 | 30 | 0.03 |
| | | | | | 120 | 78 | 0.07 |

Practical Examples 1 and 2

A ceramic substrate mounted with an optical semiconductor element was placed on a hot plate and heated to 120° C. A room temperature (25° C.) hydrosilylation-curable silicone composition (JCR 6125; Dow Corning Toray Co., Ltd.) was deposited dropwise upon the substrate using a dispenser. 15 mg composition was deposited at a time. The shape of the deposited composition was observed 15 minutes after having been deposited (Practical Example 1). A similar procedure was also performed except that the substrate was heated to 150° C. (Practical Example 2). The results are shown in Table 2. In the table, "○" indicates that the cured product had a convex shape in which the ratio of the height of the cured product to the diameter of the bottom thereof was at least 0.2, and "×" indicates a non-convex shape in which this ratio was less than 0.2. The results are shown in Table 2.

TABLE 2

| | Substrate temperature | Shape |
|---|---|---|
| Practical Example 1 | 120° C. | ○ |
| Practical Example 2 | 150° C. | ○ |

Practical Examples 3 to 5 and Comparative Examples 1 and 2

A ceramic substrate mounted with an optical semiconductor element was placed on a hot plate and heated to 130° C. A room temperature (25° C.) hydrosilylation-curable silicone composition (0E-6370HF; Dow Corning Toray Co., Ltd.) was deposited dropwise upon the substrate using a dispenser. 15 mg composition was deposited at a time. The shape of the deposited composition was observed 15 minutes after having been deposited (Practical Example 3). A procedure similar to that performed in Practical Example 3 was also performed except that the substrate was heated to 150° C. and 180° C. (Practical Examples 4 and 5). In the table, "○" indicates that the cured product had a convex shape in which the ratio of the height of the cured product to the diameter of the bottom thereof was at least 0.2, and "×" indicates a non-convex shape in which this ratio was less than 0.2. As comparative examples 1 and 2, a similar procedure was performed except that the substrate was heated to 25° C. and 120° C. The results are shown in Table 3.

TABLE 3

| | Substrate temperature | Shape |
|---|---|---|
| Practical Example 3 | 130° C. | ○ |
| Practical Example 4 | 150° C. | ○ |
| Practical Example 5 | 180° C. | ○ |
| Comparative Example 1 | 25° C. | × |
| Comparative Example 2 | 120° C. | × |

Comparative Example 3

The substrate upon which the optical semiconductor element was mounted was adjusted to 25° C. A room temperature (25° C.) hydrosilylation-curable silicone composition (OE-6370HF; Dow Corning Toray Co., Ltd.) was deposited dropwise upon the substrate using a dispenser. 15 mg composition was deposited at a time. After the composition had been deposited, it was immediately placed in a circulating hot air oven heated to 150° C., and the shape of the deposited composition was observed after 15 minutes had passed. In the table, "○" indicates that the cured product had a convex shape in which the ratio of the height of the cured product to the diameter of the bottom thereof was at least 0.2, and "×" indicates a non-convex shape in which this ratio was less than 0.2. The results are shown in Table 4.

TABLE 4

| | Substrate temperature | Shape |
|---|---|---|
| Comparative Example 3 | 25° C. Heated in 150° C. oven immediately after being deposited | × |

Comparative Example 4

A ceramic substrate mounted with an optical semiconductor element was placed on a hot plate and heated to 150° C. A room temperature (25° C.) hydrosilylation-curable silicone composition (OE-6630; Dow Corning Toray Co., Ltd.) was deposited dropwise upon the substrate using a dispenser. 15 mg composition was deposited at a time. The shape of the deposited composition was observed 15 minutes after having been deposited. In the table, ○ indicates that the cured product had a convex shape in which the ratio of the height of the cured product to the diameter of the bottom thereof was at least 0.2, and x indicates a non-convex shape in which this ratio was less than 0.2. The results are shown in Table 5.

TABLE 5

| | Substrate temperature | Shape |
|---|---|---|
| Comparative Example 4 | 150° C. | x |

Comparative Example 5

A ceramic substrate mounted with an optical semiconductor element was placed on a hot plate and heated to 150° C. A room temperature (25° C.) hydrosilylation-curable silicone composition (OE-6636; Dow Corning Toray Co., Ltd.) was deposited dropwise upon the substrate using a dispenser. 15 mg composition was deposited at a time. The shape of the deposited composition was observed 15 minutes after having been deposited. In the table, "○" indicates that the cured product had a convex shape in which the ratio of the height of the cured product to the diameter of the bottom thereof was at least 0.2, and "×" indicates a non-convex shape in which this ratio was less than 0.2. The results are shown in Table 6.

TABLE 6

| | Substrate temperature | Shape |
|---|---|---|
| Comparative Example 5 | 150° C. | x |

INDUSTRIAL APPLICABILITY

The manufacturing method of the present invention allows for the efficient manufacture of a hemispherical, hemicylindrical, dome-shaped, or similar convex cured product upon a substrate using a curable silicone composition. Thus the manufacturing method is useful as a sealing method for semiconductor elements such as light emitting diodes (LED), semiconductor lasers, photodiodes, phototransistors, solid state imaging elements, light emmiting elements and light receiving elements used for photocouplers, or the like.

DESCRIPTION OF SYMBOLS

1 Substrate
2 LED
3 Convex cured product
4 Reflective member

The invention claimed is:

1. A method of manufacturing an integrated piece comprising a convex cured product and a substrate, the method comprising depositing dropwise or dispensing a curable silicone composition onto the substrate that is pre-heated, the composition reaching a torque value of 1 dN·m within 60 seconds from immediately after beginning measurement using a curelastometer according to JIS K 6300-2, at a temperature to which the substrate is pre-heated, and having a viscosity at the temperature of at least 0.05 Pa·s.

2. The method according to claim 1, wherein the temperature is at least 50° C.

3. The method according to claim 2, wherein the ratio of the viscosity of the curable silicone composition at the temperature to which the substrate is pre-heated to the viscosity of the curable silicone composition at 25° C. is at least 0.01.

4. The method according to claim 2, wherein the substrate is a semiconductor device or a substrate for a semiconductor device.

5. The method according to claim 4, wherein the semiconductor device is an optical semiconductor device.

6. The method according to claim 1, wherein the ratio of the viscosity of the curable silicone composition at the temperature to which the substrate is pre-heated to the viscosity of the curable silicone composition at 25° C. is at least 0.01.

7. The method according to claim 6, wherein the substrate is a semiconductor device or a substrate for a semiconductor device.

8. The method according to claim 7, wherein the semiconductor device is an optical semiconductor device.

9. The method according to claim 1, wherein the substrate is a semiconductor device or a substrate for a semiconductor device.

10. The method according to claim 9, wherein the semiconductor device is an optical semiconductor device.

11. The method according to claim 1, wherein the viscosity at 25° C. of the curable silicone composition is at least 2.0 Pa·s.

12. The method according to claim 1, wherein the refractive index at 25° C. of the curable silicone composition is less than 1.50.

13. The method according to claim 1, wherein the curable silicone composition is hydrosilylation reaction-curable.

14. The method according to claim 1, wherein the integrated piece further comprises a semiconductor element and the convex cured product seals the semiconductor element upon the substrate.

15. The method according to claim 14, wherein the semiconductor element is an optical semiconductor element.

16. The method according to claim 15, wherein the optical semiconductor element is an LED.

17. An optical device comprising the integrated piece obtained according to the method claim 1.

* * * * *